(12) United States Patent
Heightley et al.

(10) Patent No.: US 7,071,745 B2
(45) Date of Patent: Jul. 4, 2006

(54) VOLTAGE-CONTROLLED ANALOG DELAY LOCKED LOOP

(75) Inventors: John D. Heightley, Colorado Springs, CO (US); Steve S. Eaton, San Jose, CA (US)

(73) Assignee: ProMOS Technologies, Inc., Hsinchu (TW)

( * ) Notice: Subject to any disclaimer, the term of this patent is extended or adjusted under 35 U.S.C. 154(b) by 37 days.

(21) Appl. No.: 10/776,366

(22) Filed: Feb. 11, 2004

(65) Prior Publication Data

US 2005/0174155 A1  Aug. 11, 2005

(51) Int. Cl.
*H03L 7/06* (2006.01)

(52) U.S. Cl. .................. 327/158; 327/149; 327/161

(58) Field of Classification Search ............. 327/142, 327/147, 149, 152–153, 156, 158, 161
See application file for complete search history.

(56) References Cited

U.S. PATENT DOCUMENTS

| 5,355,037 A | 10/1994 | Andresen et al. |
| 6,087,868 A | 7/2000 | Millar |
| 6,339,354 B1 | 1/2002 | Heightley |
| 6,346,839 B1 | 2/2002 | Mnich |
| 6,359,487 B1 | 3/2002 | Heightley et al. |
| 6,469,559 B1 | 10/2002 | Heightley |
| 6,628,154 B1 * | 9/2003 | Fiscus ................ 327/158 |

* cited by examiner

*Primary Examiner*—Timothy P. Callahan
*Assistant Examiner*—Cassandra Cox
(74) *Attorney, Agent, or Firm*—Peter J. Meza; William J. Kubida; Hogan & Hartson LLP (57) ABSTRACT

An analog delay locked loop for receiving a reference clock signal and for generating a delayed output clock signal includes a voltage controlled delay line, a fixed delay line, a delay voltage control, a fast/slow latch, a phase detector, as well as reset and clock off circuits. The fast/slow latch generates three signals that are received by the delay voltage control: a "latched slow signal", a "latched fast signal", as well as a "latched fast to slow signal". The phase detector generates "go fast" and "go slow" signals that are received by the fast/slow latch. The analog delay locked loop sets the initial delay of the delay line at or near its minimum value on start-up. The delay is then forced to increase from the minimum value until a locking condition is achieved independent of the phase relationship between the reference and delayed clock signals.

21 Claims, 9 Drawing Sheets

STARTING PHASE RELATIONSHIP

*Fig. 6A*

PHASE AFTER DELAY IS INCREASED & BEFORE FIRST SLWL

*Fig. 6B*

PHASE AFTER DELAY IS INCREASED & AFTER FIRST SLWL

Fig. 8

VOLTAGE-CONTROLLED ANALOG DELAY LOCKED LOOP

BACKGROUND OF THE INVENTION

The present invention relates, in general, to the field of delay locked loops ("DLLs"). More particularly, the present invention relates to an analog delay locked loop in which the voltage-controlled delay through the analog delay line is initialized at or near the minimum possible delay.

Delay locked loops (DLLs) are known in the prior art. A delay locked loop is a type of control loop that adjusts a variable delay line to maintain minimum phase error between an output sync clock signal and an input reference clock signal. The object of a delay locked loop is to add an integer number of clock periods of delay to an undelayed clock signal in order to create a delayed replica clock signal that is in phase with the undelayed clock signal. The delay control is achieved either through voltage control of an analog delay line or through digital control of a digital delay line.

An example of a prior art analog delay locked loop can be found in U.S. Pat. No. 6,346,839 B1, to Mnich entitled "Low Power Consumption Integrated Circuit Delay Locked Loop and Method for Controlling The Same", which is hereby incorporated by reference. In particular, FIG. 1 of the '839 patent, which is reproduced as FIG. 1A in the present application, is a simplified block diagram of a delay locked loop 10 including a voltage controlled delay line 12, a fixed delay line 14, a delay voltage control 16A, phase detector 18A, fast/slow latch 22A, and integrating capacitors C0 and C1. The phase detector 18A generates "Go Fast" and "Go Slow" control signals that are received by the fast/slow latch 22A. In turn, fast/slow latch 22A generates "Latched Fast" and "Latched Slow" control signals that are received by the delay voltage control 16A.

Figure 1A:
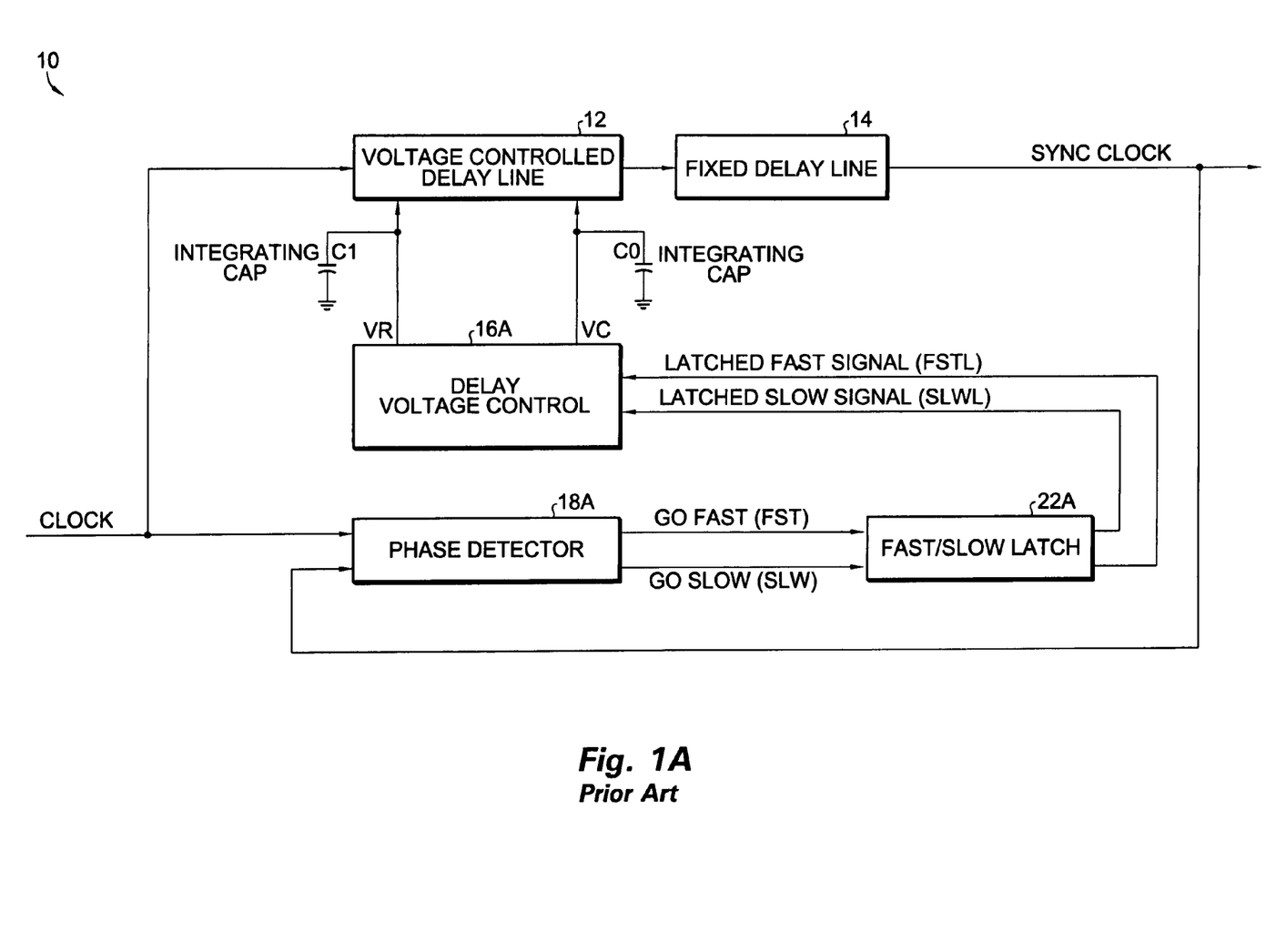
FIG. 1A is a block diagram of a prior art analog delay locked loop.

In the prior art delay locked loop 10 shown in FIG. 1A, there is a potential for the phase detector 18A to indicate that the delay through the delay line 12, 14 should be reduced via the voltage controlled delay line 12 when it is not possible to achieve a lock condition by reducing the delay, because the minimum achievable delay exceeds the delay needed to achieve a lock condition. In addition, the delay at which the DLL 10 locks may not be the minimum possible delay for the range of delays available, because of the requirement to set a relatively long initial delay in order to address the non-locking condition described above. Setting a long initial delay causes jitter to be higher than it would be if the lock point were set at a shorter delay point.

In the prior art DLL 10 shown in FIG. 1A, the probability of the non-locking condition described above occurring is minimized by adding flip-flop delay elements in the CLOCK path of phase detector that are not in the SYNC path as shown in FIG. 5 of the '839 patent. This causes the so-called "Go Slow" signal, "SLW," to occur before the "Go Fast" signal, "FST," on start-up or after DLL 10 is reset. The phase detector 18A is in turn reset when the first FST signal occurs. The so-called "fast/slow latch" circuit 22A assures that only a "latched slow" signal, "SLWL" occurs. In most cases, this assures that the SLWL signal occurs in each subsequent cycle until DLL 10 reaches a locked condition. However, if the initial delay through the total delay path 12, 14 of DLL 10 is such that the rising edge of the CLOCK signal input to phase detector 18A is close enough before the rising edge of the SYNC CLOCK signal, phase detector 18B cannot reset fast enough after the first occurrence of the FST signal and the next rising edge of the SYNC CLOCK signal will be ignored. When this happens, only the "Latched Fast" signal "FSTL" signal continues to occur in each subsequent cycle until DLL 10 reaches a lock condition—if the delay can be reduced enough to lock. If the required delay to lock is shorter than the minimum achievable delay through the delay line 12, 14, DLL 10 will not be able to lock.

In order to further minimize the probability of the "non-locking" condition described above, the initial delay through the delay line 12, 14 is set so that for the frequencies of interest, DLL 10 is able to achieve a locked condition even if a FSTL signal occurs with the first and subsequent FST signals. However, it is difficult to establish such an initial delay over all process, voltage, and temperature conditions. Furthermore, in order to allow for a decision that the delay through the delay line 12, 14 should be reduced, the initial delay of the delay line is ideally set to a relatively long delay in order to allow locking to be achieved at a shorter delay. If DLL 10 is not initialized to or near its minimum delay, but rather at the preferred "long" initial delay, there is a chance of not having the shortest or optimum delay solution for a given clock frequency. Locking at long delays makes DLL 10 more susceptible to jitter due to power and ground noise.

Digital delay locked loops are known in the prior art that have the initial delay set to a minimum value and incrementally increase the delay. However, digital delay lines have less phase resolution than voltage controlled (analog) delay lines. Furthermore, in digital delay locked loops there exits a possibility of missing a transition to a mode in which the delay must be allowed to be reduced as well as increased in order to maintain a locked condition. This missed transition is more likely in a digital delay loop because of the incremental size of the digital adjustments and the nature of the circuit used to detect the transition. In order not to miss this transition, a so-called "time window" is created in the phase detection circuit that is longer than the adjustment increment. Setting a time window over all voltage, temperature, and process variations is difficult to achieve. Clock jitter can also cause the delayed signal to move outside the time window and lock will be lost. An adjustment of one delay increment (for example, using multiple gate delays) made in every clock cycle as the delayed clock moves in and out of the time window when the DLL is locked can result in substantial jitter.

Other known digital delay lines in the prior art have attempted to address the problem of missing the transition to the case where the delay must be decreased by making the allowable time window much wider. To achieve this, the loop of the DLL can be opened prior to the time the delayed signal's rising edge falls into the time window and the loop is closed after the rising edge falls inside the time window. The phase detector of the DLL is only used to determine when the delayed signal has fallen inside the time window initially and only begins to control the delay of the delay line after that point. A significant amount of additional circuitry is required to determine when the delayed signal is inside the time window and to control the transition between the dual mechanisms used for controlling the delay of the delay line.

What is desired, therefore, is an analog delay locked loop circuit that avoids the problems inherent to digital delay locked loop circuits, as well as the jitter and non-locking condition problems associated with certain prior analog delay locked loop circuits.

SUMMARY OF THE INVENTION

According to the present invention an analog delay locked loop includes reference and sync clock signals, a voltage controlled delay line, a fixed delay line, a delay voltage control, a fast/slow latch, a phase detector, as well as reset and clock off circuits. The fast/slow latch generates three signals that are received by the delay voltage control: a "latched slow signal", a "latched fast signal", as well as a "latched fast to-slow signal". The phase detector generates "go fast" and "go slow" signals that are received by the fast/slow latch.

The analog delay locked loop of the present invention substantially reduces the problems with prior analog solutions by setting the initial delay of the delay line at or near its minimum value on start-up or after the DLL is reset. The delay is then forced to increase initially even if the phase detector and fast/slow latch combination initially generate a latched fast signal. As the delay increases on subsequent cycles, eventually the phase difference reaches a point where a latched slow signal is generated. From this point on, the delay is decreased when a latched fast signal occurs and increased when a latched slow signal occurs. Since the delay can only be increased until a true latched slow signal occurs near the lock point, the delay never needs to be decreased except to keep the DLL in a locked condition. Thus, the undesirable condition of trying to reduce the delay below the minimum achievable delay is avoided.

The present invention assures that the DLL locks at the minimum delay within the range of the delay line required for a given frequency, thus minimizing the DLL jitter due to voltage variations.

The present invention requires no time windows since the delayed signal changes phase in very small increments of delay as the transition to being able to go fast occurs and after the DLL is locked. No adjustments are made once lock is achieved until the two signals differ in phase by the resolution of the phase detector, which is less than 50 picoseconds or on the order of magnitude of the inherent jitter.

The delay loop of the present invention is always closed. By using the phase detector and fast/slow latch combination to always control the delay and by using the phase detector to determine when to begin allowing the delay to be decreased, the circuitry is greatly simplified.

The present invention benefits from the analog characteristics of the delay line and from the continuously decreasing magnitude of the adjustments near the transition point.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1B:
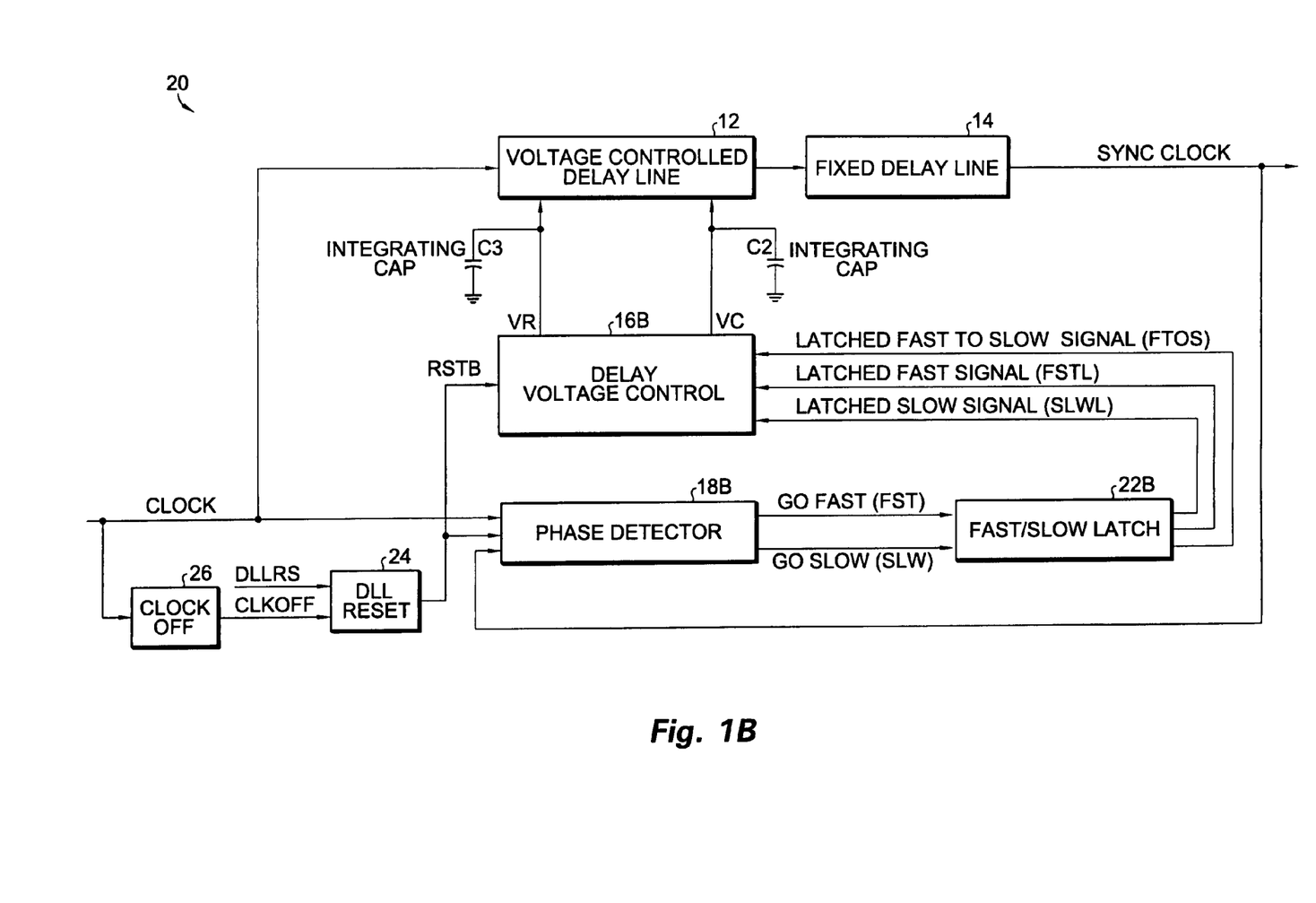
FIG. 1B is a block diagram of an analog delay locked loop according to the present invention including a voltage controlled delay line, a fixed delay line, a delay voltage control, a phase detector, a fast/slow latch, a DLL reset circuit, and a clock off circuit.

A block diagram of the analog DLL 20 according to the present is shown in FIG. 1B. The input of analog DLL 20 receives an input reference CLOCK signal and provides a delayed SYNC CLOCK output signal. A delay voltage control circuit 16B provides the VR and VC control signals to the voltage controlled delay line 12. Integrating capacitors C2 and C3 are coupled to the VR and VC control signal lines at the outputs of the delay voltage control circuit 16B. A phase detector circuit 18B receives the CLOCK and SYNC signals, and generates "Go Fast" (FST) and "Go Slow" (SLW) control output signals. A fast/slow latch 22B receives the FST and SLW control signals and generates three output control signals: "Latched Slow Signal" (SLWL); "Latched Fast Signal" (FSTL); and "Latched Fast to Slow Signal" (FTOS) as is explained in further detail below. The delay voltage control circuit 16B receives the SLWL, FSTL, and FTOS control signals, and generates the VR and VC control signals for voltage controlling the delay of delay line 12. In addition, a DLL reset circuit 24 is added in order to properly initialize and reset phase detector 18B and the delay voltage control circuit 16B. Another circuit, the "clock off" circuit 26 is also added that causes DLL 20 to be reset after the CLOCK signal has been off without requiring a separate DLL reset signal.

Figure 2:
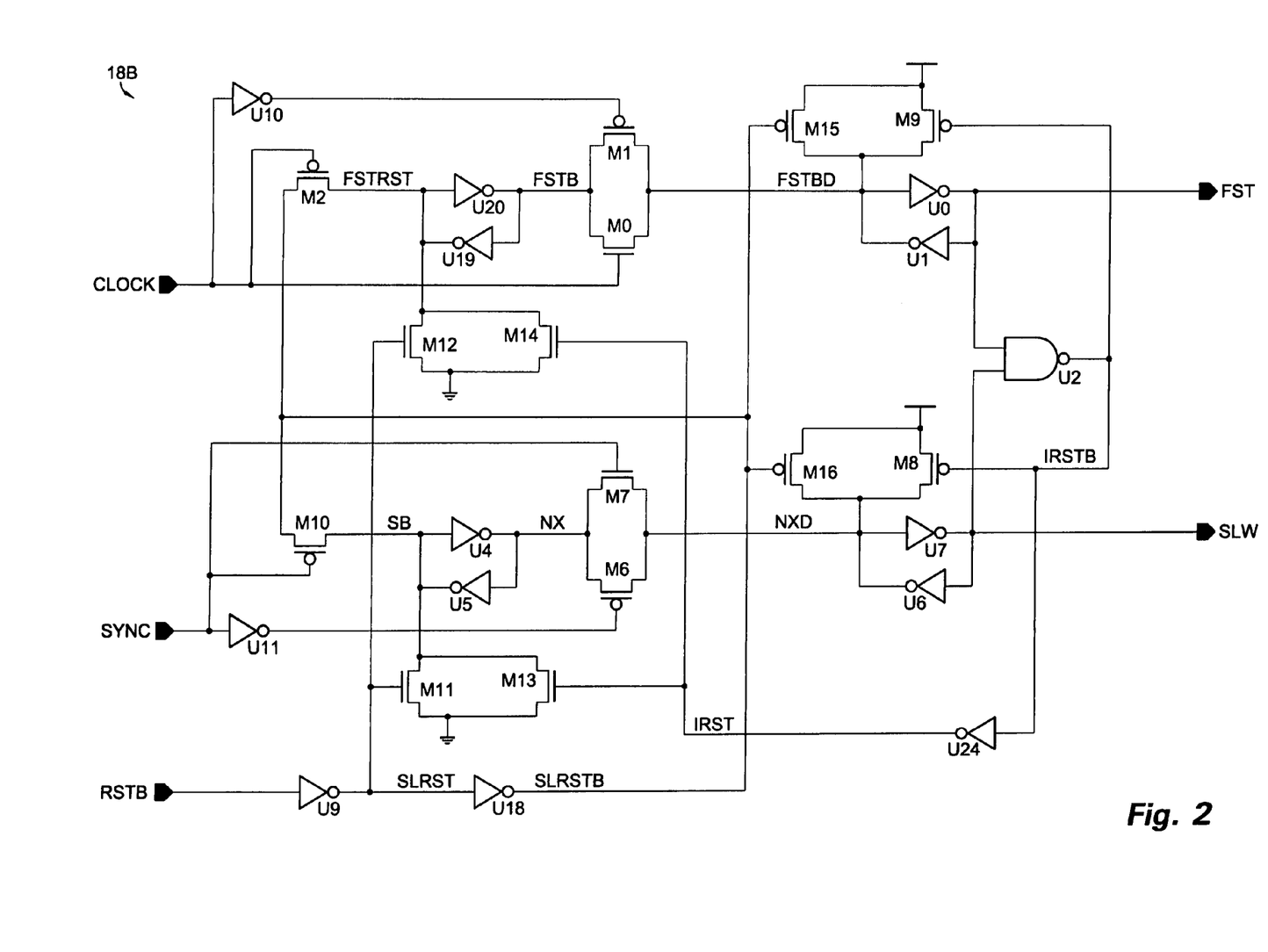
FIG. 2 is a schematic diagram of the phase detector shown in FIG. 1B.

Referring now to FIG. 2, a schematic diagram reveals the circuit details of phase detector 18B. The extra flip-flops in the CLOCK path of the prior art phase detector are eliminated in the present invention. Those flip-flops were intended to cause a "Go Slow" signal to occur first on start-up or after reset. But, as described below, this may actually generate a "false" SLWL signal. A false SLWL signal results in subsequent FSTL signals indicating that the delay in the delay line should be reduced. The DLL 10 will not lock if this false SLWL signal occurs since the delay is initialized at the minimum possible delay. Phase detector 18B has been modified to separate the internal and external reset paths and to reduce the number of gate delays in the paths as is described in further detail below. This allows phase detector 18B to be reset faster thus permitting higher frequency operation.

Phase detector 18B is in the reset state when the reset signal RSTB at the input to inverter U9 is low and latches U19/U20, U4/U5, U0/U1, and U6/U7 are initialized such that nodes "FSTRST" (input of inverter U20) and "SB" (input of inverter U4) are low and nodes "FSTBD" and "NXD" are high. Output signals FST (output of latch U0/U1) and SLW (output of latch U6/U7) will both be low. When reset signal RSTB goes high the latches are released and node "SLRSTB" (output of inverter U18) goes high. Nodes "FSTRST" and "SB" are set high as soon as either signal CLOCK or signal SYNC goes low, respectively. Consider the situation where the phase relationship between CLOCK and SYNC is such that CLOCK goes high slightly before SYNC goes high. If CLOCK goes high very close to the time when RSTB goes high, there will not be enough time to set node FSTRST high when CLOCK is still low and no FST signal will occur when CLOCK goes high. Since SYNC is later, node SB can be set high while SYNC is still low and on the rising edge of SYNC, output SLW will go high and SLWL from the fast/slow latch 22B will go high. On the next rising edge of CLOCK, FST will go high causing the phase detector 18B and fast/slow latch 22B to be reset. If CLOCK goes high close enough before SYNC goes high, the reset of the phase detector 18B will not be released soon enough for node SB to be set high before SYNC goes high and no SLW signal will be generated when SYNC goes high. When CLOCK and SYNC both go low, both FSTRST and SB will be set high. Since CLOCK is slightly ahead of SYNC, signal FST will be generated on the next rising edge of CLOCK, causing FSTL to be generated by the fast/slow latch circuit 22B. Reset of the phase detector 18B and fast/slow latch 22B will occur when SYNC goes high generating SLW and this pattern will repeat itself. Since FSTL will be interpreted as a "Go Fast" signal after the occurrence of the first SLWL signal, the DLL will not lock because it has been set at the minimum delay. Thus, for the phase relationships described above, a "false" initial SLWL can occur. In order to avoid this failure mode, it is important that RSTB and CLOCK be synchronized such that RSTB goes high on the falling edge of CLOCK. This allows a full half cycle for setting node "FSTRST" high through transistor M2 and setting node "FSTB" low. Node "FSTBD" (at the input of latch U0/U1) will then be driven low on the rising edge of CLOCK through transmission gate M0/M1 and the FST signal will be driven high.

Figure 3:
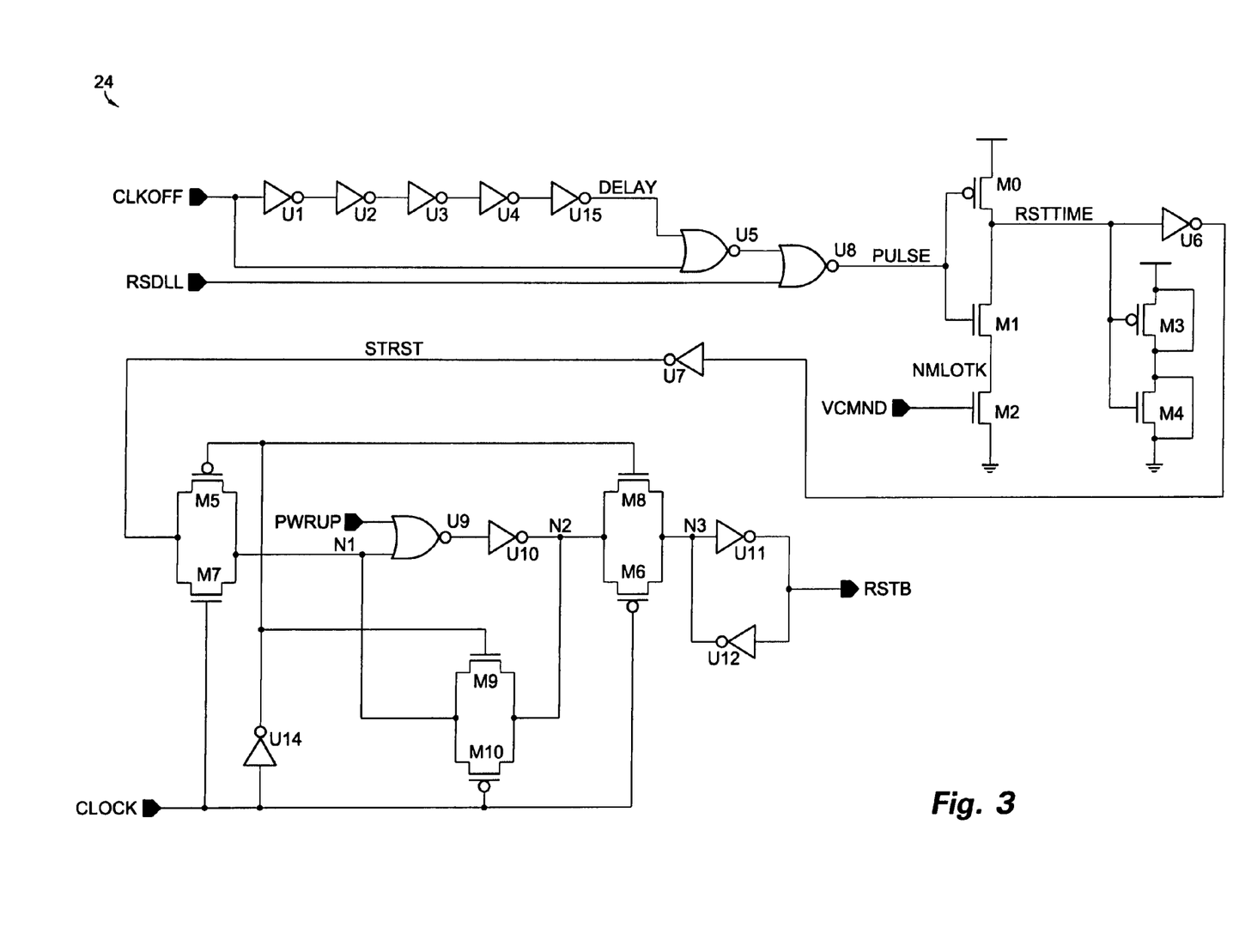
FIG. 3 is a schematic diagram of the DLL reset circuit shown in FIG. 1B.

Referring now to FIG. 3, a schematic diagram reveals the circuit details of DLL reset circuit 24. In normal operation, the signal PWRUP at the input to NOR gate U9 goes high when power is applied and after a period of time goes low and stays low. At some point either before or after power up goes low, CLOCK will be running, signals RSDLL and CLKOFF will be low, and RSTB at the output of latch U11/U12 will be high. The CLOCK signal is provided to the gates of transistors M7, M10, and M6, as well as to the input of inverter U14. The RSDLL signal is provided to the input of NOR gate U8. The CLKOFF signal is provided to the input of inverter U1, as well to the input of NOR gate U5. To reset DLL 20, the RSDLL signal goes high for a short time causing the "PULSE" node at the gates of transistors M0 and M1 to go low for the same amount of time.

Figure 4:
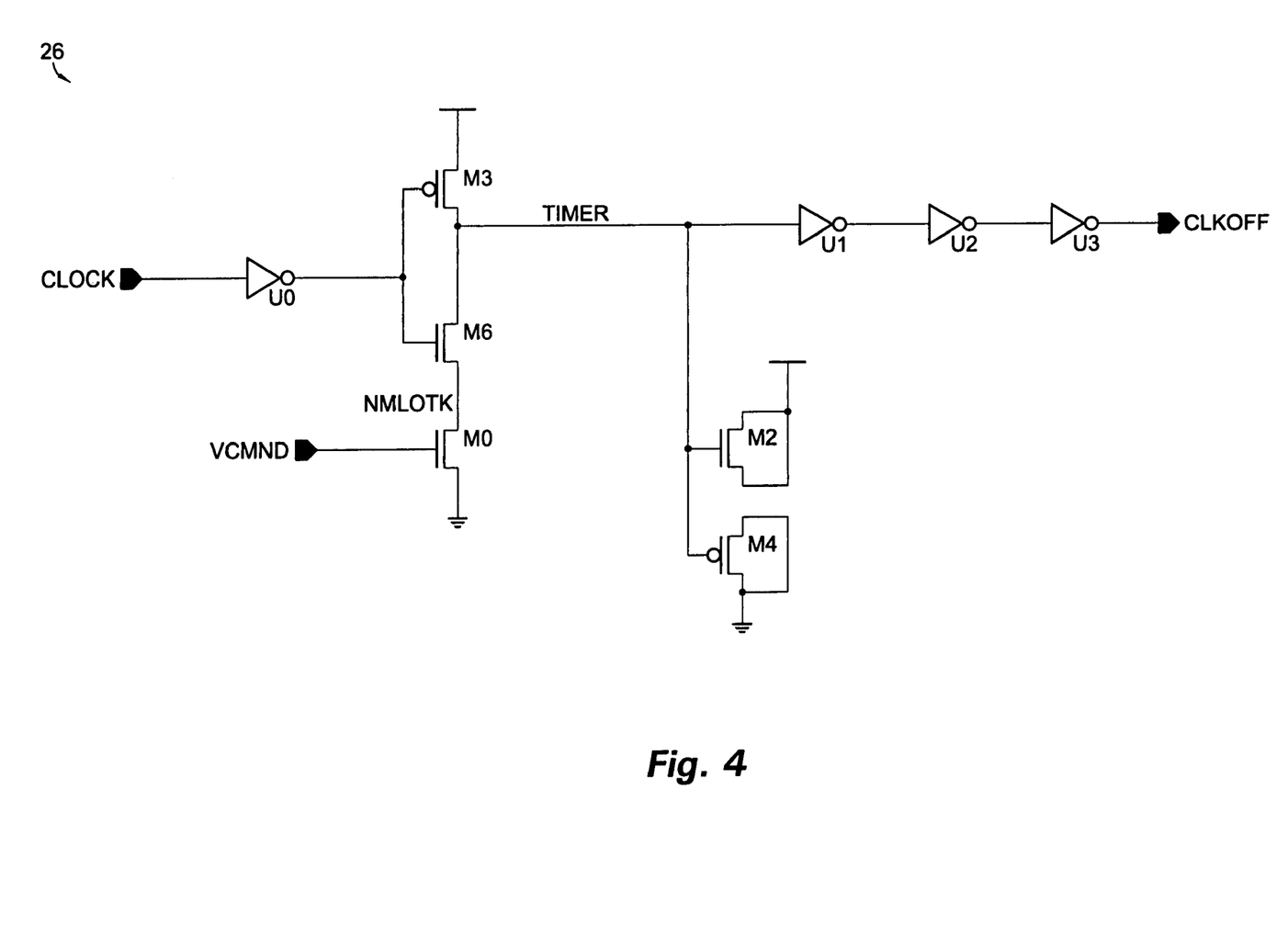
FIG. 4 is a schematic diagram of the clock off circuit shown in FIG. 1B.

Referring now to FIG. 4, a schematic diagram reveals the circuit details of the "clock off" circuit 26, which generates the CLKOFF signal. With respect to FIG. 4, if the CLOCK signal at the input to inverter U0 is low for a sufficient period of time, the node "TIMER" (input of inverter U1) will fall below the trip point on the inverter chain, U1/U2/U3, and CLKOFF will go high. With the next subsequent positive transition of CLOCK, CLKOFF immediately goes low.

Referring back to FIG. 3, the CLKOFF signal will have been low for an extended period of time and has no effect when it goes high except to cause node "DELAY" at the output of inverter U15 to go low. However, when the CLOCKOFF signal returns low after having been high, a negative going pulse is generated on the node "PULSE" at the output of NOR gate U8 of duration set by the delay from CLKOFF to the "DELAY" node. If either an RSDLL signal is present or if CLOCKOFF comes back high after being low for a predetermined period of time, the "PULSE" node goes low for a short time and the "RSTTIME" node at the input of inverter U6 is quickly set high. Once the "PULSE" node goes high again the "RSTTIME" node is slowly discharged through transistors M1 and M2. On the first rising edge of CLOCK after the "RSTTIME" node goes high, setting the "SLRST" node at the output of inverter U7 high, node "N2" at the output of inverter U10 will also go high. On the next falling edge of the CLOCK signal, RSTB will go low and reset DLL 20. The RSTB signal stays low until the "RSTTIME" node falls sufficiently to cause the output of inverter U7 to fall to the trip point of NOR gate U9 and inverter U10, causing node "N2" to go low on the next rising edge of the CLOCK signal. The RSTB signal will then go high on the next falling edge of the CLOCK signal, achieving the required synchronization. The reason for "stretching" the time that the RSTB signal stays low via the "RSTTIME" node is to allow sufficient time for the control voltage of the voltage controlled delay line 12 to be reset to the initialization value.

Figure 5:
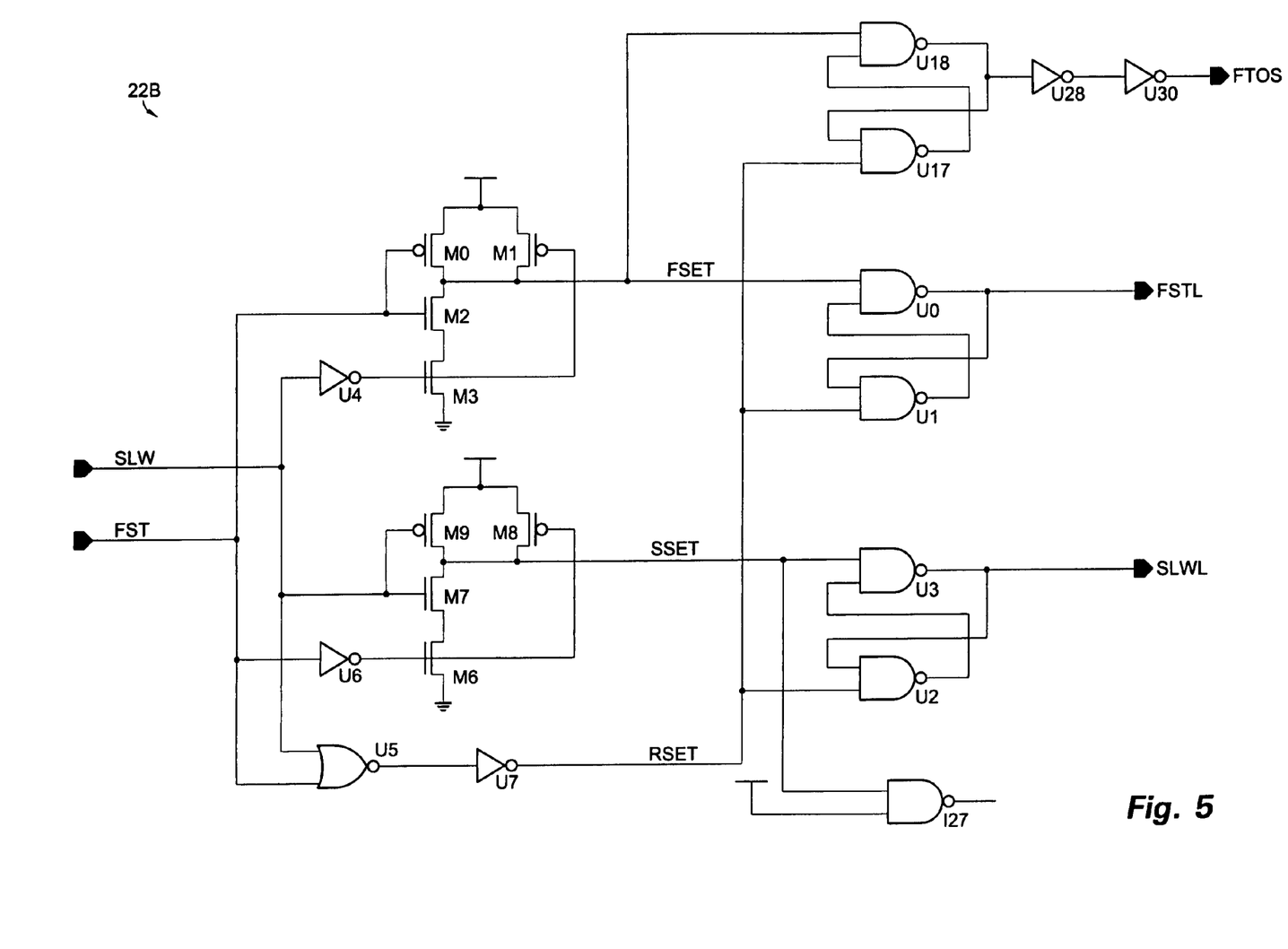
FIG. 5 is a schematic diagram of the fast/slow latch circuit shown in FIG. 1B.

Referring now to FIG. 5, a schematic diagram reveals the circuit details of fast/slow latch circuit 22B. One of the advantageous features of the prior art phase detector and fast/slow latch combination is that the pulse width of the FSTL or SLWL signal is large when large phase changes are required and small when small phase changes are required. The changes thus become very small as the analog DLL 20 approaches the locked condition. The device sizes of the latches U0/U1 and U2/U3 are chosen so there is minimum delay between FST going high and FSTL going high and between SLW going high and SLWL going high respectively. On the other hand, the delay is extended in resetting the latches when both FST and SLW go low. Thus, there is a minimum pulse width associated with the latched signals that is set by the delay time in resetting the latches. A minimum adjustment to the voltage controlled delay line 12 is thus assured near the locked condition. This minimum width is required because for very near lock conditions, the pulse can disappear before it can cause any change in control voltage and no delay adjustments will occur.

In fast/slow latch 22B the SLW signal is received by inverter U4, transistors M9 and M7, and an input of NOR gate U5. The FST signal is received by transistors M0 and M2, inverter U6, and the other input of NOR gate U5. The output control signal FTOS is generated by latch U17/18, the output control signal FSTL is generated by latch U0/U1, and the output control signal SLWL is generated by latch U2/U3. Logic gate I27 is used to balance the loads for the FSTL and SLWL signal paths.

As described above for the new locking scheme, when the positive FSTL signal occurs prior to the first positive transition of SLWL, the delay in the delay line 12 is to be increased, not decreased. In other words if the first FST signal from phase detector 18B occurs before the first SLW signal, it must actually be interpreted as a "Go Slower" signal.

Figure 6A:
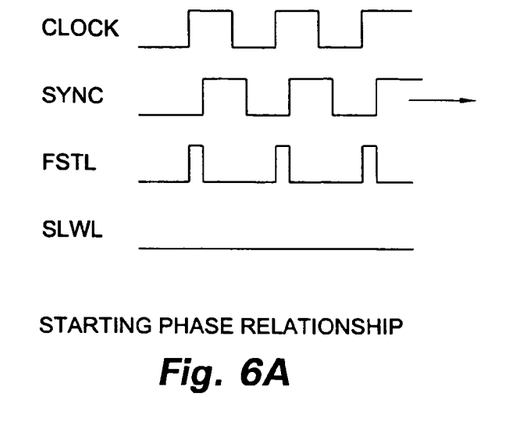
FIGS. 6A, 6B, and 6C are timing diagrams associated with the analog delay locked loop of the present invention shown in FIG. 1B.
Figure 6B:
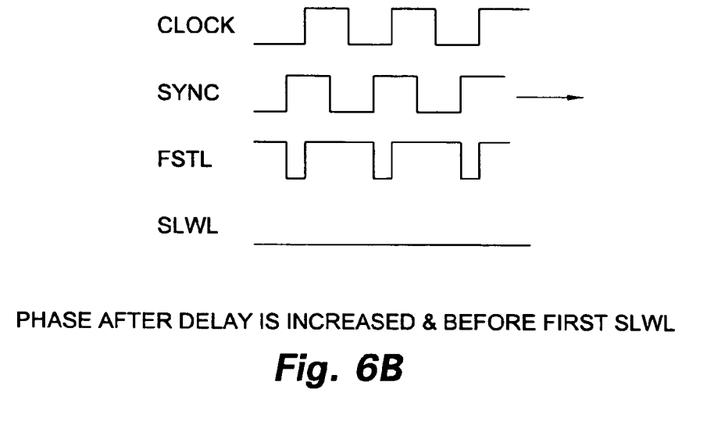
Figure 6C:
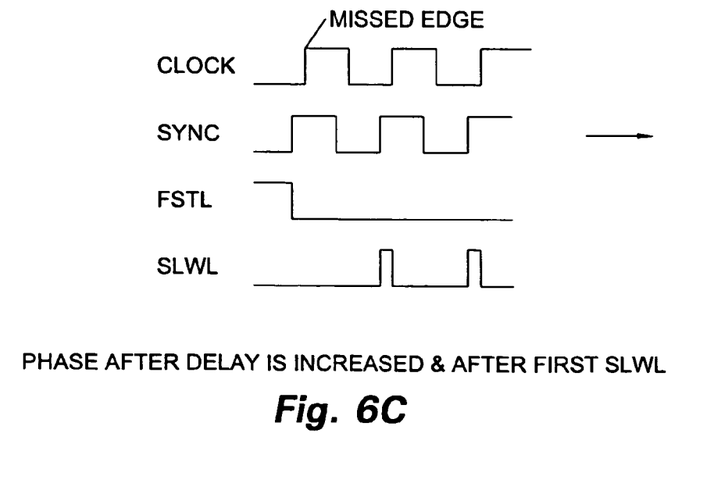

Referring generally now to the timing diagrams of FIGS. 6A, 6B, and 6C, further detail in the timing relationships between various signals associated with analog DLL 20 is revealed. FIG. 6A shows the phase relationship between the CLOCK and SYNC signals that results in the FST signal going high before the SLW signal goes high, and the FSTL pulse that results. In this case, the FSTL signal causes the delay in delay line 12 to increase, not decrease as indicated by the arrow. FIG. 6B shows the phase relationship after the delay has been increased by nearly one clock period and just before the point when the phase detector 18B and fast/slow latch circuit 22B results in a true SLWL signal. FIG. 6C shows the phase relationship after a slight further increase in delay causes the rising edge of the CLOCK signal to be missed and the first SLWL signal to occur.

Regarding FIG. 6A, if the high state of FSTL is used to control the magnitude of the adjustments as in the prior art, the adjustments will be small because FSTL is narrow. In the prior art, each FSTL pulse will move SYNC to the left (faster). In the present invention, prior to the first true SLWL, each FSTL pulse will move SYNC to the right (slower). Small adjustments are desired in the case of the prior art since SYNC is near the lock condition when moving left. However, in the present invention, prior to the occurrence of the first true SLWL, large adjustments are desired because SYNC has to move a long way to the right to achieve lock.

Regarding FIG. 6B, if the high state of FSTL is used to control the magnitude of the adjustments as in the prior art, the adjustments will be large because FSTL is wide. In the prior art, each FSTL pulse will move SYNC to the left (faster). In the present invention, prior to the first true SLWL, each FSTL pulse will move SYNC to the right (slower). Large adjustments are desired in the case of the prior art since SYNC has a long way to move to the left to achieve lock. However, in the present invention, prior to the occurrence of the first true SLWL, small adjustments are desired because SYNC is very close to the lock condition moving to the right.

Therefore, if the high state of FSTL is used to control the magnitude of the adjustments during the period before the first true SLWL, the adjustments are small when it is desired to have them large, and large when it is desired to have them small. However, if the low state of FSTL is used to control the magnitude of the adjustments prior to the first true SLWL, the desired behavior is achieved since the low state is wide when the high state is narrow and vice versa. In the case shown in FIG. 6A, the adjustments will be large because the low state of FSTL is wide. In the case shown in FIG. 6B, the adjustments will be small since the low state of FSTL is narrow. After the first occurrence of a true SLWL signal, the widths of the high states of FSTL and SLWL control the magnitude of the fast and slow adjustments, respectively.

One problem with using the low state of FSTL to control the magnitude of the adjustments using the prior art fast/slow latch circuit is that since the falling edge of the FSTL signal is delayed in order to assure the minimum positive pulse width of the FSTL signal, the signal may never go low when the phase difference becomes very small as is shown in FIG. 6B. To overcome this problem, a third latch, U17/U18, has been added in fast/slow latch circuit 22B that has an output signal called "Fast to Slow" (FTOS). This latch and associated output driver, U28/U30, have ratios such that the delay between when FST and SLW both go low, which resets the latches and causes FTOS to go low, is minimized. The delay time between when FST goes high and when FTOS goes high is extended. Thus a minimum width negative pulse is assured for FTOS that is set by the delay between FST going high and FTOS going high.

Figure 7:
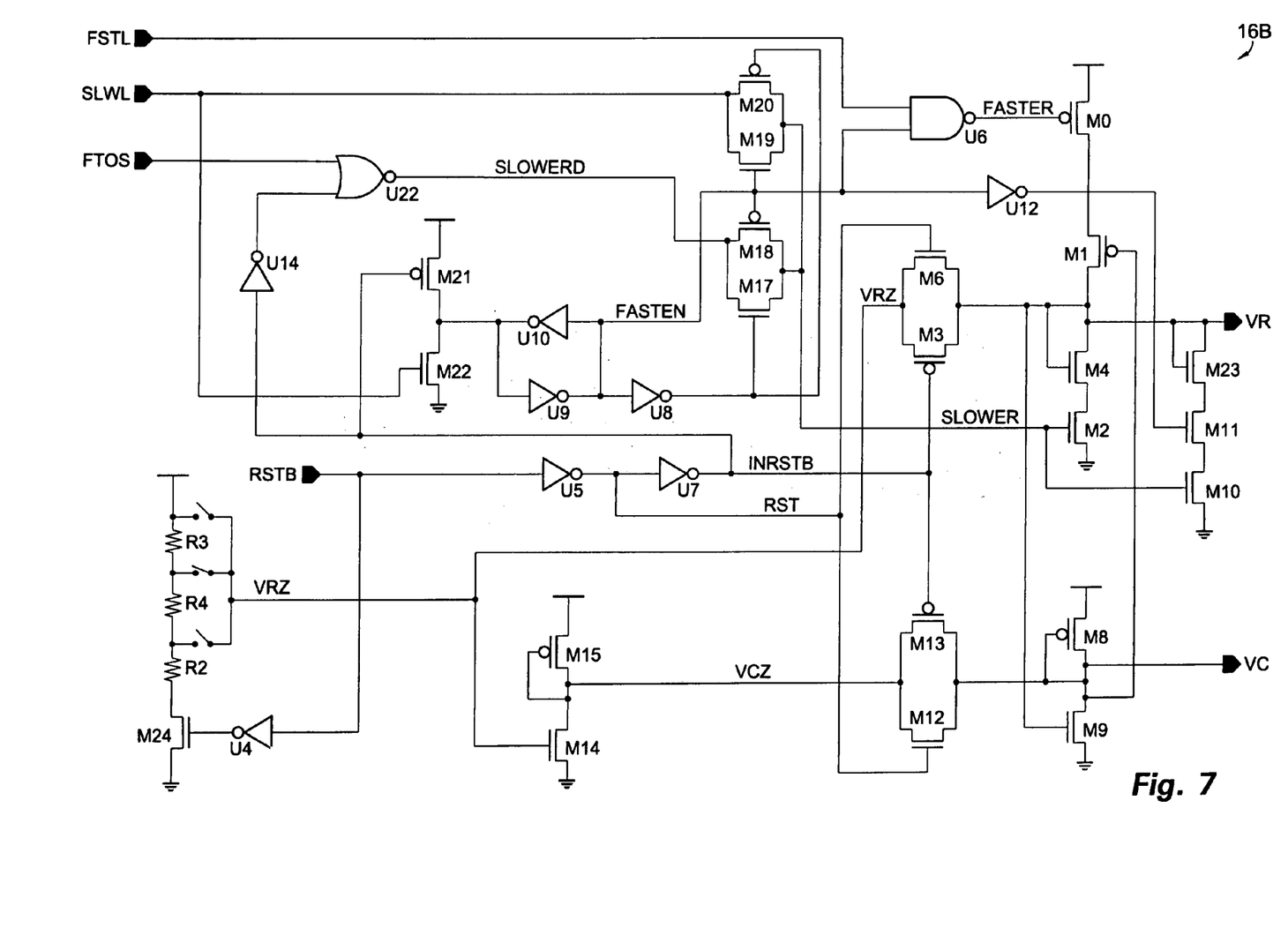
FIG. 7 is a schematic diagram of a first embodiment of a delay voltage control circuit shown in FIG. 1B.

Referring now to FIG. 7, a schematic diagram reveals the circuit details of a first embodiment of the delay voltage control circuit 16B. When the analog DLL 20 is reset, signals FSTL, SLWL, and FTOS are low. Signal RSTB will also be low causing the "INRSTB" node at the output of inverter U7 to be low. The latch U9/U10 is thus reset so that the "FASTEN" node at the input of inverter U8 is low. In this state, the "SLOWERD" node at the output of NOR gate U22 is passed to the "SLOWER" node at the gate of transistor M2 through transmission gate, M17/M18. The SLWL signal is blocked by a second transmission gate, M19/M20. When the FTOS signal is low after the RSTB signal has gone high, the "SLOWER" node is high and charge is pulled off the charge integrating capacitor on node VR through transistors M2/M4 and M10/M11/M23 in parallel. The voltage on the VC node at the output of transistors M8 and M9 will rise as the voltage on the VR node at the output of transistors M1 and M4 falls. These changes in VR and VC in turn cause the delay through the voltage controlled delay line 12 to increase. As long as the "FASTEN" node is low, the "FASTER" node at the gate of transistor M0 is held high. On the first positive transition of the SLWL signal after the RSTB signal has gone high, the latch U9/U10 is set so that the "FASTEN" node goes high. At this point, the SLWL signal is passed to the "SLOWER" node through transmission gate M19/M20 and the signal on the "SLOWERD" node is blocked by transmission gate M17/M18. The current path M10/M11/M23 is also turned off at this point so the adjustment current is smaller after the first SLWL occurs. This allows the adjustments to be smaller when the DLL approaches lock without penalizing the locking time. Once the "FASTEN" node goes high, the voltage on the "FASTER" node is controlled by the FSTL signal in the normal fashion. Therefore, the delay can be either increased or decreased depending on whether the SLWL or the FSTL signal goes high.

The lower portion of the delay voltage control circuit 16B shown in FIG. 7 establishes the initial value to which the VR and VC node voltages are initialized during reset. When the RSTB signal is low, i.e., the analog DLL 20 is being reset, the bias stack R2/R3/R4/M24 is turned on and the voltage on node "VRZ" is set at or near the supply voltage, depending on which of the options is selected. The voltage on node "VCZ" is also set to its initial value as determined by the impedance ratio of transistors M14 an M15 and the level of the voltage on node "VRZ". Since the transmission gates M3/M6 and M12/M13 are both on when the RSTB signal is low, the reset values on the "VRZ" and "VCZ" nodes are passed to the VR and VC nodes, respectively. When the RSTB signal goes high, the transmission gates are turned off and VR responds to the input signals FSTL, SLWL, and FTOS as described above. The VC node is slaved to the VR node as is determined by the impedance ratio of transistors M8 and M9 and the voltage level of the VR node. The reason that the initial value of the "VRZ" may not be set to the supply voltage is that the delay of the delay line typically changes very little as VR drops a few tenths of volt from the supply voltage level. By skipping over this range, the locking time can be improved without affecting the actual locking delay. As discussed with respect to FIG. 3, the reset input pulse is stretched in order that the RSTB signal stays low long enough for the large charge integrating capacitors on nodes VR and VC to reach their initialization values.

Figure 8:
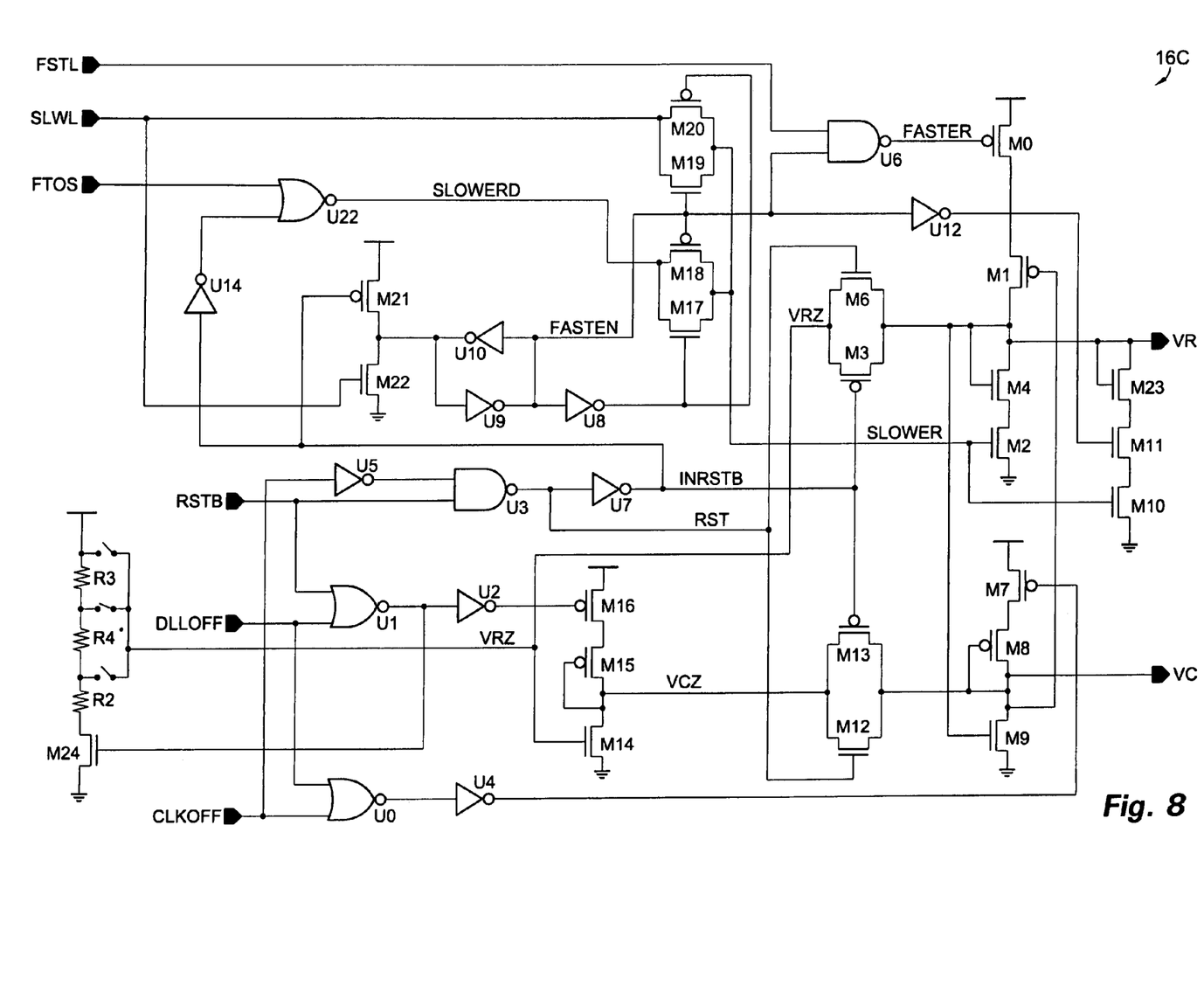
FIG. 8 is a schematic diagram of a second embodiment of a delay voltage control circuit shown in FIG. 1B including a power savings feature.

It is desirable that as much DC current in the delay voltage control circuit 16B as possible is eliminated under the conditions that the DLL is off or CLOCK is off. A second embodiment of the voltage control circuit 16C is shown in FIG. 8, which incorporates a current saving feature according to the present invention including gates U0, U1, U3, and inverter U5. When signal DLLOFF is high, substantially all DC current is eliminated. When signal DLLOFF is low and CLKOFF is high, no current is eliminated if RSTB is low because this implies the DLL is being reset even though the clock is off. When signal DLLOFF is low, signal CLKOFF is high and signal RSTB is high, all of the current is eliminated. The VR node will be at the power supply voltage and the VC node will be at ground. Establishing these levels of VR and VC when the CLOCK signal is off is important in order to eliminate the possibility of through current in the voltage controlled delay elements.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An analog delay locked loop comprising:
an analog delay line having an associated minimum delay;
an input for receiving a reference clock signal;
an output for providing a delayed clock signal;
a phase detector and fast/slow latch coupled to the phase detector for receiving the reference and delayed clock signals, and for providing output control signals; and
means for controlling the delay through the analog delay line responsive to the output control signals including first and second charge integrating capacitors such that the delay is initialized at or near the minimum delay.

2. The analog delay locked loop according to claim 1 in which the delay through the analog delay line only increases initially, independent of the phase relationship between the reference and delayed clock signals.

3. The analog delay locked loop according to claim 1 in which the delay through the analog delay line only increases initially. independent of the output control signals of the phase detector.

4. The analog delay locked loop according to claim 2 in which the magnitude of incremental delay increases are proportional to the phase difference between the reference and delayed clock signals.

5. The analog delay locked loop according to claim 1 in which the delay through the analog delay line is increased or decreased after the rising edge of the delayed clock signal is ahead of the rising edge of the reference clock signal by a minimum time.

6. The analog delay locked loop according to claim 1 in which the phase detector and fast/slow latch further comprises means for generating a first indication that the delay is to be increased.

7. The analog delay locked loop according to claim 1 in which the fast/slow latch circuit includes an output for generating a positive going variable width signal for indicating that the delay through the analog delay line should be decreased.

8. The analog delay locked loop according to claim 1 in which the fast/slow latch circuit includes an output for generating a positive going variable width signal for indicating that the delay through the analog delay line should be increased.

9. The analog delay locked loop according to claim 1 in which the fast/slow latch circuit includes an output for generating a negative going variable width signal for indicating That the delay through the analog delay line should be increased.

10. The analog delay locked loop according to claim 1 in which the fast/slow latch circuit includes means for generating first, second, and third output control signals having a width dependent upon the phase difference between the reference clock signal and the delayed clock signal.

11. The analog delay locked loop according to claim 1 in which the fast/slow latch circuit includes means for generating three variable width signals, two positive signals having a designated minimum high time and one negative signal having a designated minimum low time.

12. The analog delay locked loop according to claim 1 in which the means for controlling the delay through the analog delay line only responds to a negative going variable width signal generated by the fast/slow latch circuit until a first positive going signal generated by the fast/slow latch for indicating that the delay though the analog delay line should be increased goes positive for a first time.

13. The analog delay locked loop according to claim 12 in which the fast/slow latch circuit includes means for generating a second positive going signal for indicating that the delay through the analog delay line should be decreased.

14. The analog delay locked loop according to claim 13 in which, after the first occurrence of the first positive going signal, the means for controlling the delay through the analog delay line only responds to said first and second positive going signals.

15. The analog delay locked loop according to claim 1 in which the means for controlling the delay through the analog delay line comprises means for generating a first magnitude of control voltage adjusting current until a positive going signal generated by the fast/slow latch for indicating that the delay should be increased goes positive for a first time and, after that, for generating a second magnitude of adjusting current.

16. The analog delay locked loop according to claim 1 further comprising a reset circuit for preventing a false control signal from being generated by the phase detector.

17. The analog delay locked loop according to claim 1 further comprising a reset circuit that causes the analog delay locked loop to be reset as soon as the reference clock starts after having been off for a predetermined minimum time.

18. The analog delay locked loop according to claim 1 further comprising a reset circuit having a reset time sufficient for the charge integrating capacitors to reset to an initializing value independent of the width of an input reset signal.

19. The analog delay locked loop according to claim 1 in which the means for controlling the delay through the analog delay line comprises three different levels of DC bias current depending on whether the analog delay locked loop is on with the reference clock signal running, on with the reference clock signal not running, or off.

20. The analog delay locked loop according to claim 1 in which the means for controlling the delay through the analog delay line comprises a delay voltage control circuit having an input coupled to the fast/slow latch and an output coupled to the analog delay line.

21. An analog delay locked loop comprising:
- a clock input;
- a sync output;
- a phase detector coupled to the clock input and sync output;
- a fast/slow latch for generating three output control signals coupled to the phase detector;
- a delay voltage control circuit coupled to the fast/slow latch having first and second outputs;
- first and second integrating capacitors respectively coupled to the first and second outputs of the delay voltage control circuit;
- a voltage controlled analog delay line having an input coupled to the clock input, first and second control terminals respectively coupled to the first and second outputs of the delay voltage control circuit, and an output coupled to the sync output through a fixed delay line.

* * * * *

UNITED STATES PATENT AND TRADEMARK OFFICE
CERTIFICATE OF CORRECTION

PATENT NO. : 7,071,745 B2  Page 1 of 1
APPLICATION NO. : 10/776366
DATED : July 4, 2006
INVENTOR(S) : John D. Heightley and Steve S. Eaton It is certified that error appears in the above-identified patent and that said Letters Patent is hereby corrected as shown below:

Column 10, line 9, "That" should be --that--

Signed and Sealed this

Third Day of October, 2006

JON W. DUDAS
*Director of the United States Patent and Trademark Office*